United States Patent [19]

Rode

[11] 4,139,820
[45] Feb. 13, 1979

[54] A.C. AND D.C. VOLTAGE POLARITY INDICATOR UTILIZING ELECTROCHROMIC CELLS

[75] Inventor: Oyars A. Rode, Riga, U.S.S.R.

[73] Assignee: Latviisky Gosudarstvenny Universitet Imeni P. Stuchki, Riga, U.S.S.R.

[21] Appl. No.: 796,230

[22] Filed: May 12, 1977

[30] Foreign Application Priority Data

May 17, 1976 [SU] U.S.S.R. .................. 2360113

[51] Int. Cl.² ........................................... G01R 19/14
[52] U.S. Cl. ..................................... 324/133; 324/96; 350/357
[58] Field of Search ............... 324/51, 29.5, 72.5, 324/86, 96, 108, 122, 133, 149; 340/324 R, 324 M, 372, 336; 350/357

[56] References Cited

U.S. PATENT DOCUMENTS

| 2,762,977 | 9/1956 | Krueger | 324/133 |
| 3,188,526 | 6/1965 | Engel | 324/122 X |
| 3,304,498 | 2/1967 | Myers | 324/122 X |
| 3,614,610 | 10/1971 | Legatti | 324/133 X |

FOREIGN PATENT DOCUMENTS 1011161 6/1952 France .................. 324/72.5

*Primary Examiner*—Gerard R. Strecker
*Attorney, Agent, or Firm*—Lackenbach, Lilling & Siegel

[57] ABSTRACT

An electrochromic voltage indicator for detecting the presence and polarity of d.c. voltage, as well as for detecting the presence of a.c. voltage, includes two electrochromic cells, two contact terminals, two capacitors, two resistors and two diodes. First leads of each of the diodes are interconnected and are connected to first leads of each of the resistors and to first leads of each of the electrochromic cells. A second lead of each of the electrochromic cells is electrically connected via a respective capacitor to a second lead of the respective resistor to a second lead of the respective diode and to the respective contact terminal.

1 Claim, 1 Drawing Figure

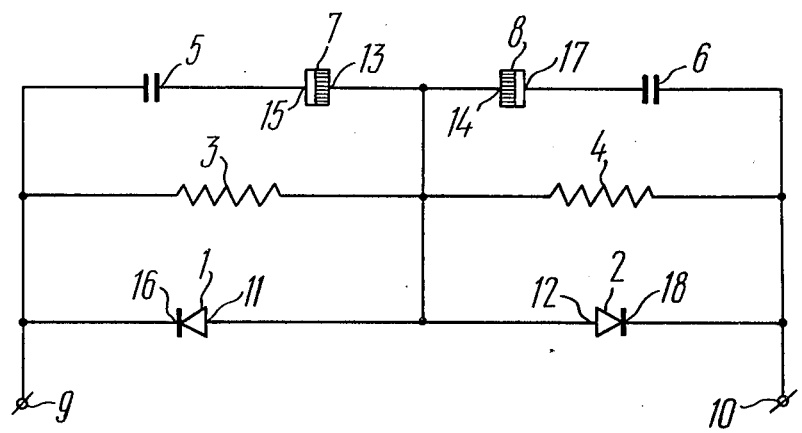

A.C. AND D.C. VOLTAGE POLARITY INDICATOR UTILIZING ELECTROCHROMIC CELLS

The present invention relates to optoelectronics and, more specifically, to an electrochromic voltage indicator which can be used for testing electronic circuits, and can be incorporated in video display devices and electromagnetic radiation intensity modulation devices.

In conventional electrochromic voltage indicators, an electrochromic cell, connected via contact terminals to an electronic circuit being tested, is placed in a metal can.

An electrochromic cell is, for purposes of this application, defined as an optical cell whose optical properties vary depending on the polarity and magnitude of the voltage applied between its cathode and anode. This means that the cell exhibits coloration if voltage is applied thereto, and the coloration is eliminated when the polarity of voltage is reversed.

Coloration of the electrochromic cell in the known electrochromic voltage indicator only occurs upon the application of negative potential to the cathode and positive potential to the anode, which indicates the presence of d.c. voltage of a known polarity.

It is difficult to detect the presence of d.c. voltage of an unknown polarity in such a case. If a negative potential is applied to the anode of an uncolored cell, and a positive potential is applied to the cathode, the cell does not exhibit coloration and thus cannot indicate the presence of voltage.

In order to detect the presence and polarity of such a voltage, it is necessary to interchange at least once the contact terminals connected to the testing points of the circuit.

The known electrochromic voltage indicator cannot detect the presence of a.c. voltage, whose period is less than the color/bleach time determined by maximum coloration and bleaching rates of the electrochromic cell.

Besides, the electrochromic cell of such an electrochromic voltage indicator remains colored for a prolonged period of time after removal of the voltage from across the contact terminals.

It is an object of the invention to provide an electrochromic voltage indicator which makes it possible to detect the presence and polarity of d.c. voltage in a single measurement.

It is another object of the invention to provide an electrochromic voltage indicator which detects the presence of a.c. voltage.

It is still another object of the invention to provide an electrochromic voltage indicator whose electrochromic cell can be bleached rapidly after removal of a voltage from between its contact terminals.

The foregoing and other objects of the invention are attained by providing an electrochromic voltage indicator, in which an electrochromic cell is electrically connected to a pair of contact terminals, comprising, according to the invention, an additional electrochromic cell, two capacitors, two resistors and two diodes, first leads of the diodes being interconnected and being connected to first leads of the resistors and to first leads of the electrochromic cells. The second lead of each of the cells is electrically connected via the respective capacitor to the second lead of the respective resistor, to the second lead of the respective diode and to the respective contact terminal of the indicator.

Other objects and advantages of the present invention will become more apparent from the following detailed description of a preferred embodiment thereof to be read in conjunction with the accompanying drawing which is an electrical diagram of an electrochromic voltage indicator according to the invention.

The proposed electrochromic voltage indicator comprises two diodes 1 and 2, two resistors 3 and 4, two capacitors 5 and 6, two electrochromic cells 7 and 8, and two contact terminals 9 and 10. Like leads 11 and 12 of the diodes 1 and 2 are interconnected and are connected to first leads of the resistors 3 and 4 and to like leads 13 and 14 of the electrochromic cells 7 and 8.

A lead 15 of the electrochromic cell 7 is electrically connected via the capacitor 5 to the second lead of the resistor 3, to a lead 16 of the diode 1, and to the contact terminal 9.

A lead 17 of the electrochromic cell 8 is electrically connected via the capacitor 6 to the second lead of the resistor 4, to a lead 18 of the diode 2 and to the contact terminal 10.

The proposed electrochromic voltage indicator operates as follows.

When the contact terminal 10 is connected to a common point of an electronic circuit being tested, and the contact terminal 9 is connected to another testing point, which has a positive potential in relation to the common point, the electrochromic cell 7 exhibits coloration under the action of a charging current of the capacitor 5 passing through the diode 2 and the resistor 4.

If the potential at the testing point is negative in relation to the common point, the electrochromic cell 8 exhibits coloration under the action of a charging current of the capacitor 6 passing through the diode 1 and the resistor 3.

If a.c. voltage is present at the testing point, the electrochromic cells 7 and 8 exhibit coloration during each half-cycle under the action of charging currents of the capacitors 5 and 6.

When one of the contact terminals 9 and 10 is, or both terminals are, disconnected from the circuit being tested or if there is zero potential at the testing point, the capacitors 5 and 6 discharge via the respective electrochromic cells 7 and 8 and the resistors 3 and 4.

As a result, voltage of opposite polarity is applied across the electrochromic cells 7 and 8, bleaching the cells 7 and 8.

Thus, the presence of d.c. voltage of one polarity results in coloration of the electrochromic cell 7, while the presence of d.c. voltage of the opposite polarity results in coloration of the electrochromic cell 8. Coloration of both cells 7 and 8 indicates the presence of a.c. voltage.

The proposed electrochromic voltage indicator can also be used in systems for modulating optical radiation passing through or reflected from the electrochromic cells 7 and 8, as well as in d.c. and a.c. voltage-controlled video display devices.

I claim:

1. An electrochromic voltage indicator comprising: a first electrochromic cell having a first lead associated with one polarity and a second lead associated with another polarity of said first cell; a second electrochromic cell having a first lead associated with one polarity and a second lead associated with another polarity of said second cell, said first leads associated with like polarities of said first and second electrochromic cells being connected to each other; a first diode having a first lead associated with one electrode thereof and a second lead associated with the other electrode thereof; a second diode having a first lead associated with one electrode thereof and a second lead associated with the other electrode thereof, said first leads associated with like electrodes of said first and second diodes being connected to each other; first and second contact terminals of the indicator; first and second resistors each having a first lead and a second lead, said first leads of said first and second resistors, of said first and second electrochromic cells, and of said first and second diodes being connected to each other; a first capacitor having a first lead connected to said second lead of said first electrochromic cell, and a second lead connected to said second lead of said first resistor, and to said second lead of said first diode and to said first contact terminal of the indicator; and a second capacitor having a first lead connected to said second lead of said second electrochromic cell, and a second lead connected to said second lead of said second resistor, and to said second lead of said second diode and to said second contact terminal of the indicator.

* * * * *